United States Patent [19]

Kohl

[11] 4,263,106

[45] Apr. 21, 1981

[54] SOLDER PLATING PROCESS

[75] Inventor: Paul A. Kohl, Chatham, N.J.

[73] Assignee: Bell Telephone Laboratories, Incorporated, Murray Hill, N.J.

[21] Appl. No.: 108,963

[22] Filed: Dec. 31, 1979

[51] Int. Cl.³ .......................... C25D 3/32; C25D 3/36; C25D 3/60

[52] U.S. Cl. .................................. 204/43 S; 204/53; 204/54 R

[58] Field of Search ..................... 204/43 S, 53, 54 R, 204/54 L, 114, 123

[56] References Cited

U.S. PATENT DOCUMENTS

| | | | |
|---|---|---|---|
| 3,661,730 | 5/1972 | Nishihara | 204/43 S |
| 3,749,649 | 7/1973 | Valayil | 204/43 S |
| 3,875,029 | 4/1975 | Rosenberg et al. | 204/43 S |
| 3,956,123 | 5/1976 | Rosenberg et al. | 204/54 R |
| 4,007,047 | 12/1976 | Ostrow et al. | 204/43 S |
| 4,162,205 | 7/1979 | Wilson et al. | 204/43 S |

OTHER PUBLICATIONS

Robert Taft et al., Trans. Kansas Academy of Science, vol. 42, pp. 173–188, (1942).
A. Kenneth Graham et al., Tech. Proc. Am. Electroplater's Soc., vol. 50, pp. 139–146, (1963).
Abner Brenner, "Electrodeposition of Alloys", vol. II, pp. 4–25, (1963).

*Primary Examiner*—G. L. Kaplan
*Attorney, Agent, or Firm*—Walter G. Nilsen

[57] ABSTRACT

A process for electroplating tin, lead or alloys of tin and lead from aqueous acidic baths. The baths comprise lactones, lactams, cyclic sulfate esters, cyclic imides and cyclic oxazolinones. The additives assist in providing a process which permits high speed plating with excellent layer properties such as smooth platings free from dendritic growth and having constant plating thickness over wide areas.

17 Claims, No Drawings

SOLDER PLATING PROCESS

TECHNICAL FIELD

The invention involves electroplating of metals such as tin, lead, and alloys of tin and lead.

BACKGROUND OF THE INVENTION

Deposits of tin, lead and alloys of these two metals are extensively used in a wide variety of functional and decorative applications. For example, many decorative and functional articles are covered with tin, lead or alloys of these metals to prevent tarnishing, surface corrosion, etc., or to provide a shiny lusterous surface. Also, such surfaces are often used for bearing contact surfaces to provide lubrication and reduce friction.

An increasingly important use of such deposits is in electronic circuits, electronic devices and electrical connectors. The surface layers of tin, lead and alloys are used as protective layers to prevent corrosion or in a patterning procedure during the fabrication or printed circuits or integrated circuits. Also, such layers are used to maintain good surface electrical contact. The layers are also used to provide chemically stable surfaces for soldering. This is done both on wires and on printed wire boards (or other substrates for electric and integrated circuits) to facilitate rapid mechanical and electrical connections.

It is highly desirable to obtain smooth, level, bright electroplatings of tin, lead and alloys of these metals as rapidly as possible. In addition, it is desirable to have relatively constant plating thickness so as to insure complete coverage without excessive build-up of plating thickness.

Smooth, bright platings are desirable for aesthetic reasons and to minimize porosity for a given plating thickness. Such platings are also advantageous for electrical contact applications. Absence of dendrites or needle growth precludes chances of electrical shorts from needles broken off the surface or electrical bridges across insulator spaces between conductors. Indeed, with the close dimensional tolerances required in modern integrated circuits, absence of dendritic growth is often absolutely essential to such applications.

Constant plating thickness also reduces etching problems especially where close tolerances are involved. Etching procedures are extensively used in the fabrication of electrical circuits including integrated circuits. These etching procedures are often used to produce various patterns or masks in the fabrication procedure. Etching times often depend on the thickness of the layer being etched. Thickness variations in the tin/lead deposit results in etching times that are not constant, and are not easily predicted particularly from sample to sample or area to area in the same sample. Where very intricate patterns are desired with high tolerances, it is highly desirable to have constant thickness of the tin/lead plating.

Various references have disclosed the use of additives to tin/lead electroplating solutions. Some of these references are: W. E. Rosenberg et al, U.S. Pat. No. 3,956,123, issued May 11, 1976; S. P. Valayil, U.S. Pat. No. 3,749,646, issued July 31, 1973; K. Nishihava, U.S. Pat. No. 3,661,730 issued May 9, 1972; B. D. Ostrow, et al, U.S. Pat. No. 4,000,047, issued Dec. 28, 1976; and W. E. Rosenberg, et al., U.S. Pat. No. 3,875,029, issued Apr. 1, 1975. Various plating procedures are described by A. Brenner in the book entitled, *Electrodeposition of Alloys*, Academic Press, 1963, particularly chapter 22, pages 4–27.

SUMMARY OF THE INVENTION

The invention is a process for electroplating tin, lead and alloys of tin and lead (referred to as tin/lead plating). The plating solution contains one or more additives selected from a special class of organic compounds. This special class of compounds are lactones (cyclic esters), lactams (cyclic amides), cyclic sulfate esters (cyclic sulfone esters), cyclic imides and cyclic oxazolinones with at least one aromatic ring and up to 100 carbon atoms. For convenience, these compounds are referred to as the "heterocyclic additives". The aromatic ring may contain a variety of substituents, including hydroxy groups, alkoxy groups, amine groups, carboxylic acid groups, halide groups, aliphatic and aromatic groups with up to 10 carbon atoms. The plating bath may contain other organic compounds such as one or more of the aromatic or aliphatic polyethers. Particularly useful are the polyalkoxylated alkyl phenols such as octylphenoxy(10)polyethoxyethanol. When the heterocyclic additives are used in combination with the polyether additives, a tin/lead plating solution is obtained which permits high speed plating with excellent layer properties such as smooth platings (freedom from dendritic growth) and constant plating thickness over wide areas.

DETAILED DESCRIPTION

1. Glossary of Compounds

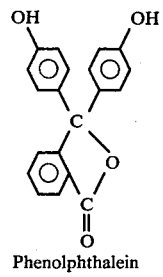

Phenolphthalein

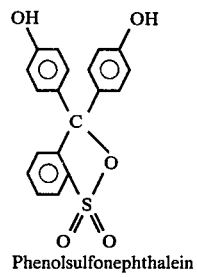

Phenolsulfonephthalein

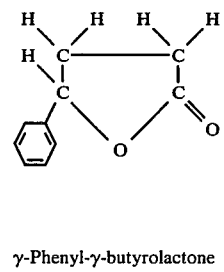

γ-Phenyl-γ-butyrolactone

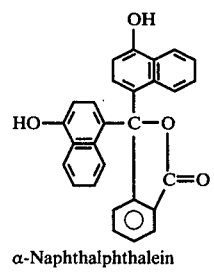

α-Naphthalphthalein

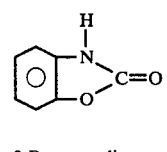

2-Benzoxazdinone

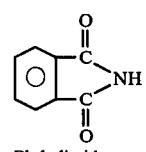

Phthalimide

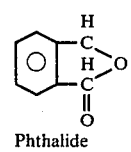

Phthalide

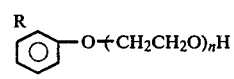

Polyethoxyalkylphenol

2. Heterocyclic Additives

The invention is a tin/lead electroplating process in which one or more organic materials are present in the electroplating solution to insure high quality platings (smooth, bright, constant thickness) even at reasonably high plating rates (i.e., above 100 Amperes per square foot). The heterocyclic compounds have various specific types of ring structures. Included in the class of compounds are lactones (cyclic esters) with at least one aromatic substituent and up to 100 carbon atoms. Particular examples are phenolphthalein and phthalein. Other types of compounds included in the class of compounds are closely related to lactones. For example, lactams (cyclic amides) with at least one aromatic substitution are included. Lactams differ from lactones in that a nitrogen atom is substituted for the ring oxygen atom in the lactone structure.

Other groups of compounds that are closely related to lactones are included in the class of compounds useful as an additive in tin/lead electroplating. For example, cyclic imides are closely related to lactones. A typical example is phthalimide. Also, oxazdinones such as 2-benzoxazdinone are useful in the practice of the invention. Particularly attractive are cyclic sulfate esters such as phenol sulfonephthalein (phenol red).

The compound should have at least one aromatic ring in the structure. This aromatic ring may be part of the cyclic structure (as with phthalein in the lactone structure) or separate from the cyclic structure as in 2 phenyl-2-butyrolactone.

The aromatic groups and other carbon atoms may have various substituents in place of hydrogen atoms. Such substituents may include hydroxyl groups, amine groups, carboxylic acid groups, halide groups (particularly bromine), aliphatic and aromatic groups with up to 10 carbon atoms.

The preferred compounds are those in which the cyclic structure (i.e., lactone or lactam structure) is attached to and partially made up of aromatic structure. This is the case with most of the compounds listed in the glossary (i.e., phthalide, phenolphthalein). Also preferred is the lactones because of availability, stability and low cost. Phenolphthalein is most preferred because it is extremely stable and readily available.

Concentration of the heterocyclic additive may vary over large limits. A concentration range from 0.005 to 5 g/liter gives excellent results. Smaller concentrations do not permit high speed plating without thickness variations in the platings. Higher concentrations do not improve the plating characteristics, and is wasteful of material. With phenolphthalein, a concentration of 0.1–0.2 g/liter is usually used.

To promote reasonable solubility of the heterocyclic additive (for example, phenolphthalein), a small amount of solvent that dissolves the additive and dissolves in the aqueous bath may be added. Typically, the additive is dissolved in alcohol and added as an alcohol solution.

3. Polyether Additives

It is advantageous to add another class of additives which further improves the quality of plating particularly at high plating rates. This class of compounds may be described as polyalkoxylated alkyl phenols in which the alkyl group may have from 1 to 20 carbon atoms. From 7 to 10 carbon atoms is preferred because of ease of availability. The number of alkoxy groups should be between 4 and 50, with 8 to 12 preferred. In addition, polyethoxy groups are preferred because of availability. Some are available under the tradename of TRITON ®. Most preferred is octyl phenoxy(10)polyethoxy ethanol because of the excellent plating characteristics (brightness, constant thickness, etc.) obtained even at very high plating rates.

A combination of the two types of additives (heterocyclic additives and polyether additives) yields exceptionally good results in that very smooth, bright platings with exceptionally constant thicknesses are obtained even at very high plating rates. Particularly important from the standpoint of fabricating integrated circuits and circuits mounted on printed wiring boards is the fact that plating occurs inside crevices and holes even at high plating rates.

Concentration of the polyether additive may vary over large limits and still produce effective results. Generally, a concentration range from 0.2 to 20 g/liter is preferred. Below 0.2 g/liter, plating quality may decrease particularly at high plating rates. Above 20 g/liter, no advantages are obtained and the excess amount of material is wasteful. More than one polyether additive may be used. Generally, it is preferred that each additive have a concentration of at least 0.2 g/liter but the total of all additives be below 20 g/liter.

4. Bath Composition

A wide variety of bath compositions may be used including compositions that are conventional and well known in the literature. Many such compositions are contained in a book entitled *Electrodeposition of Alloys-Principles and Practice* and cited above. Fluorosilicate and pyrophosphate baths are useful as is acid sulfates for tin plating baths.

A fluoborate bath is favored for most applications because of stability and high solubility of the lead and tin. High solubility permits high current densities which are necessary for high plating rates and to maintain constant thickness plating at high plating rates.

The concentrations of the various ingredients in the bath may vary over large limits. Usually, the lead and tin exist in solution as the partially ionized fluoborate (i.e., $Pb(BF_4)_2$ and $Sn(BF_4)_2$) but the solution can be made up in a variety of ways. For example, soluble lead and tin compounds may be added to an aqueous solution of fluoboric acid. Normally, the bath is made by adding lead fluoborate and tin fluoborate from stock solutions to aqueous fluoboric acid. The bath generally contains excess fluoboric acid.

An extremely useful bath composition is as follows:

| | |
|---|---|
| lead (added as $Pb(BF_4)_2$) | 8– 65 g/l |
| tin (added as $Sn(BF_4)_2$) | 15–100 g/l |
| Free $HBF_4$ | 50–600 g/l |
| phenolphthalein | 0.005– 5 g/l |
| octyphenoxy(10)polyethoxyethanol | 0.2– 20 g/l. |

Where only tin or lead is being plated, the other ingredient (lead or tin) is left out. The most preferred composition is 20–30 g/liter lead, 35–45 g/liter tin, 275–325 g/liter free fluoboric acid, 0.1–0.2 g/l phenolphthalein and 1–2 g/l octylphenoxy(10)polyethoxyethanol. Plating temperature may vary from the freezing temperature to the boiling temperature of the bath.

The bath can also be made from other lead and tin compounds besides the fluoborate. For example, PbO and SnO may be used. Advantages of such a procedure is that the oxides are cheaper. Also, since the fluoborate compounds are available in solution form, the use of the oxides reduces stripping costs and eliminates the inconvenience of shipping liquids. For a bath with 35 g/l tin, 20 g/l lead, 167 g/l of tin fluoborate solution and 71 g/l lead fluoborate solution would be needed. In constrast, only 39.3 g/l SnO(plus 26.4 g/l $HBF_4$) and 21.5 g/l PbO(plus 8.5 g/l $HBF_4$) are required for the same bath composition. Amounts of free fluoboric acid and additives are the same as above. Thus, use of the oxides is cheaper, more convenient and requires less weight of ingredients. The preferred plating temperature is from 50 to 100 degrees F. This temperature range permits high plating rates without excessive heating of the plating bath.

Plating rates may vary over large limits, usually from 1-1000 ASF or even higher. Even at low plating rates (say, below 20 ASF), the bath is advantageous because plating takes place at essentially uniform rates even in sharp crevices and holes. This is an important consideration in solder plating various articles, particularly electronic devices.

The bath composition is particularly advantageous for high speed plating, say above 100 ASF. Such platings are bright in appearance, smooth, free of dendritic or needle growth, and constant in thickness over wide areas. This is true even at plating rates of 1000 ASF and above.

What is claimed is:

1. A process for electroplating alloys of tin and lead comprising the step of passing current through an anode, aqueous acidic plating solution and cathode characterized in that the aqueous acidic plating bath comprises an heterocyclic additive consisting essentially of at least one organic compound selected from the group consisting of lactones, lactams, cyclic sulfate esters, cyclic imides and cyclic oxazolinones with at least one aromatic ring and up to 100 carbon atoms.

2. The process of claim 1 in which the aromatic ring contains at least one substituent selected from the group consisting of hydroxy group, alkoxy group, amine group, carboxylic acid group, halide group, aliphatic group and aromatic group with up to 10 carbon atoms.

3. The process of claim 2 in which the heterocyclic additive is a lactone.

4. The process of claim 1 in which the heterocyclic additive is selected from the group consisting of phenolphthalein, phthalide, phenolsulfone-phthalein, α-naphtholphthalein, 2-benzoxazdinone and phthalimide.

5. The process of claim 4 in which the heterocyclic additive consists essentially of phenolphthalein and the concentration of said phenolphthalein is from 0.005 g/l to 5.0 g/l.

6. The process of claim 5 in which the concentration of pheholphthalein is between 0.1 and 0.2 g/l.

7. The process of claim 1 in which the aqueous acidic plating solution comprises in addition to the heterocyclic additive, polyether additives which consist essentially of at least one organic compound selected from polyalkoxylated alkylphenols in which the alkyl group has from 1 to 20 carbon atoms and the number of alkoxy groups varies from 4 to 50.

8. The process of claim 7 in which the number of carbon atoms in the alkyl group is between 7 and 10, the alkoxy groups are ethoxy groups and the number of ethoxy groups is between 8 and 12.

9. The process of claim 8 in which the polyether additive is octylphenoxy(10)polyethoxyethanol with concentration range between 0.2 and 20 g/l.

10. The process of claim 1 in which the alloy plated is normally 60/40 tin-lead solder.

11. The process of claim 10 in which the aqueous acidic plating solution consists essentially of lead (in the form of $Pb(BF_4)_2$) 8-65 g/l, tin(in the form of $Sn(BF_4)_2$) 15-100 g/l, free $HBF_4$ 50-600 g/l, phenolphthalein 0.005-5 g/l and octylphenoxy(10)polyethoxyethanol 0.2-20 g/l.

12. The process of claim 11 in which the concentrations are 20-30 g/l lead, 35-45 g/l tin, 275-325 g/l free fluoboric acid, 0.1-0.2 g/l phenolphthalein and 1-2 g/l octylphenoxy(10)polyethoxyethanol.

13. The process of claim 11 in which the aqueous acidic plating solution is made by adding PbO and SnO to aqueous fluoboric acid.

14. The process of claim 1 in which the sources of tin is tin fluoborate, the source of lead is lead fluoborate and the plating solution comprises excess fluoboric acid.

15. The process of claim 1 in which the temperature of the plating solution during plating is between 50 and 100 degrees F.

16. The process of claim 1 in which the current density is greater than 100 ASF.

17. The process of claim 16 in which the current density is greater than 1000 ASF.

* * * * *